United States Patent [19]

Brown et al.

[11] Patent Number: 4,823,233

[45] Date of Patent: * Apr. 18, 1989

[54] CIRCUIT ASSEMBLY

[75] Inventors: David F. Brown, Thorplands; Michael J. Anstey, Wokingham, both of England

[73] Assignee: Dowty Electronic Components Limited, Buckinghamshire, England

[ * ] Notice: The portion of the term of this patent subsequent to Feb. 26, 2002 has been disclaimed.

[21] Appl. No.: 686,310

[22] Filed: Dec. 24, 1984

Related U.S. Application Data

[63] Continuation of Ser. No. 346,539, Feb. 8, 1982, Pat. No. 4,502,098.

[30] Foreign Application Priority Data

| Feb. 10, 1981 | [GB] | United Kingdom | 8103954 |
| Nov. 3, 1981 | [GB] | United Kingdom | 8133177 |
| Nov. 24, 1981 | [GB] | United Kingdom | 8135415 |
| Feb. 1, 1982 | [GB] | United Kingdom | 8202829 |

[51] Int. Cl.$^4$ .......................... H05K 7/20
[52] U.S. Cl. .................. 361/383; 361/412; 361/415
[58] Field of Search ............ 165/80 B, 80 D; 211/41; 339/18 B, 17 M, 18 R; 361/379, 381–384, 386, 388–389, 395, 398–400, 407–408, 412–413, 415

[56] References Cited

U.S. PATENT DOCUMENTS

| 2,471,011 | 5/1949 | Shapiro | 361/383 |
| 3,614,541 | 10/1971 | Farrand | 361/394 |
| 4,502,098 | 2/1985 | Brown et al. | 361/383 |

Primary Examiner—A. D. Pellinen
Assistant Examiner—Gregory D. Thompson
Attorney, Agent, or Firm—Watson, Cole, Grindle & Watson

[57] ABSTRACT

A circuit assembly includes a mounting structure 10 having walls 11–13, 20 with conductor strips 19 running along the length of the structure. Plate members 14 carrying components such as integrated circuits 16 have conductive areas 18 which contact the conductor strips 19 when the members are inserted into the structure 10. The walls may include slots 15 into which the plate members 14 are slidably engaged. The support structure 10 thus provides physical support for the members 14 as well as electrical interconnection therebetween. Cooling arrangements for the assembly can include apertures 21 in the walls, and/or finning 22.

5 Claims, 3 Drawing Sheets

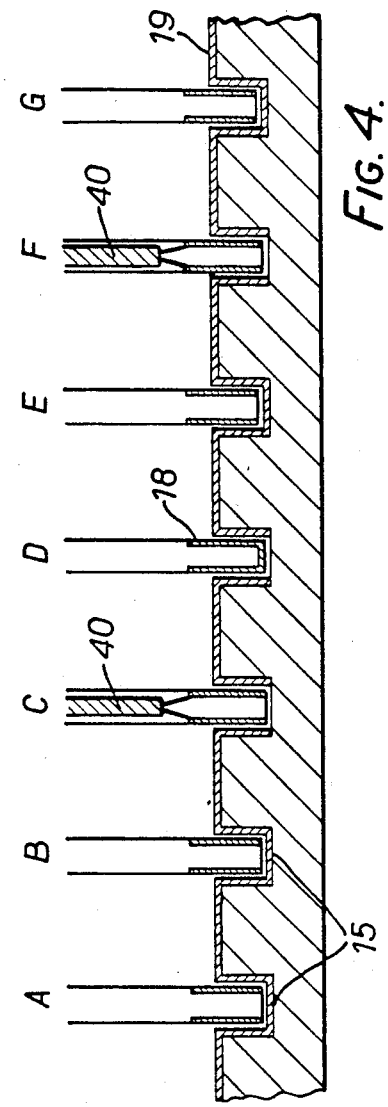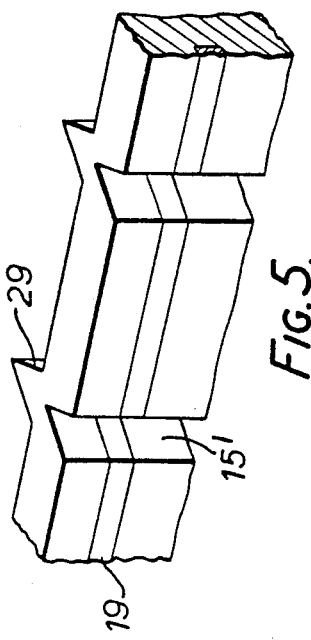

4,823,233

CIRCUIT ASSEMBLY

This application is a continuation application of application Ser. No. 346,539, filed Feb. 8, 1982, now U.S. Pat. No. 4,502,098.

The present invention relates to a circuit assembly in accordance with a constructional method suitable for the assembling of computer or other electronic equipment.

The currently available packaging for integrated circuitry and other electronic components has previously been designed to conform to traditional methods of circuit construction and specifically to soldered assembly on printed circuit boards. These traditional ideas can now be challenged in the light of rapidly falling chip counts and the reduction in the need for discrete components. It is already possible to assemble a microcomputer using a few very-large-scale integrated (VLSI) circuits. In this context, printed circuit board construction has the disadvantage of poor space utilisation, being an essentially two-dimensional layout. Also, the degree of automation in assembly is limited by virtue of the need for soldering or wire-wrapping techniques and their associated heat and static electricity problems. Furthermore, disassembly of the construction is difficult as a result of the soldered or wire-wrapped connections, unless integrated circuit sockets are used, with their associated problems of increased cost, greater risk of poor contact reliability and inefficient space utilisation.

There have been proposed recently methods involving positioning a number of boards on top of each other, but these have generally had problems associated with interconnection between boards and also have been designed for very specific applications with resulting lack of flexibility in approach. Furthermore, such methods have generally used printed circuit boards as the component-carrying members, with the consequent problems outlined above.

The present invention provides a circuit assembly comprising a plurality of plate members at least some of which carry at least one electrical component, and a mounting structure supporting the plate members in a stack, the mounting structure including a plurality of conductive members engaging co-operating conductive areas on said plate members, whereby the mounting structure provides both support for and electrical interconnection between the plate members.

Accordingly, the plate members are adapted to hold integrated or other circuitry, being stacked adjacent each other and interconnection between the plate members being by virtue of the conductive members passing through, or down outside edges of, the plate members. In the preferred form of construction, the plate members are insertable into the mounting structure which is designed to enclose the plate members and has conductive members running along its sides, insertion of the plate members making selective connection between the conductive members and the co-operating conductive areas provided on the side edges of the plate members; by this means, the plate members are both physically supported and electrically interconnected.

This form of construction has the advantages of maximising the ease of automated assembly by eliminating the necessity for soldering or wire-wrapping. Circuit assembly costs can therefore by substantially reduced. Also, disassembly of the circuitry is greatly eased in that the particular plate member can readily be removed for development, modification or repair purposes. A further advantage is that the method optimises the use of the packaging technique, in that the packaging serves the dual purpose of physical support and means of circuit construction. A number of well-accepted standards of design will ensure a high degree of compatability with present and future product ranges and eliminate the need for customised circuit-board design.

Furthermore, the preferred form of construction optimises the rigidity of the final structure, conveying significant advantages in applications in hostile environments. the design is also particularly suited to the rapidly expanding home construction market by providing a simple, reliable and rapid means of assembly.

The packaging may be designed as the original housing for the integrated circuitry (viz. incorporated at manufacture) or the technique could be used to allow the subsequent installation of conventionally packaged components.

The circuit assembly is also readily provided with cooling facilities, in that cooling spaces are created between plate members which can be further improved by the provision of perforations in the mounting structure; the mounting structure can itself act as a heatsink.

In order that the present invention may be more readily understood, embodiments thereof will now be described, by way of example, with reference to the accompanying drawings, in which:

FIG. 4 shows a side sectional view of various types of interconnection between plate members of the assembly shown in FIG. 1; and FIG. 5 shows one form of wall member for use in the system.

Figure 1:
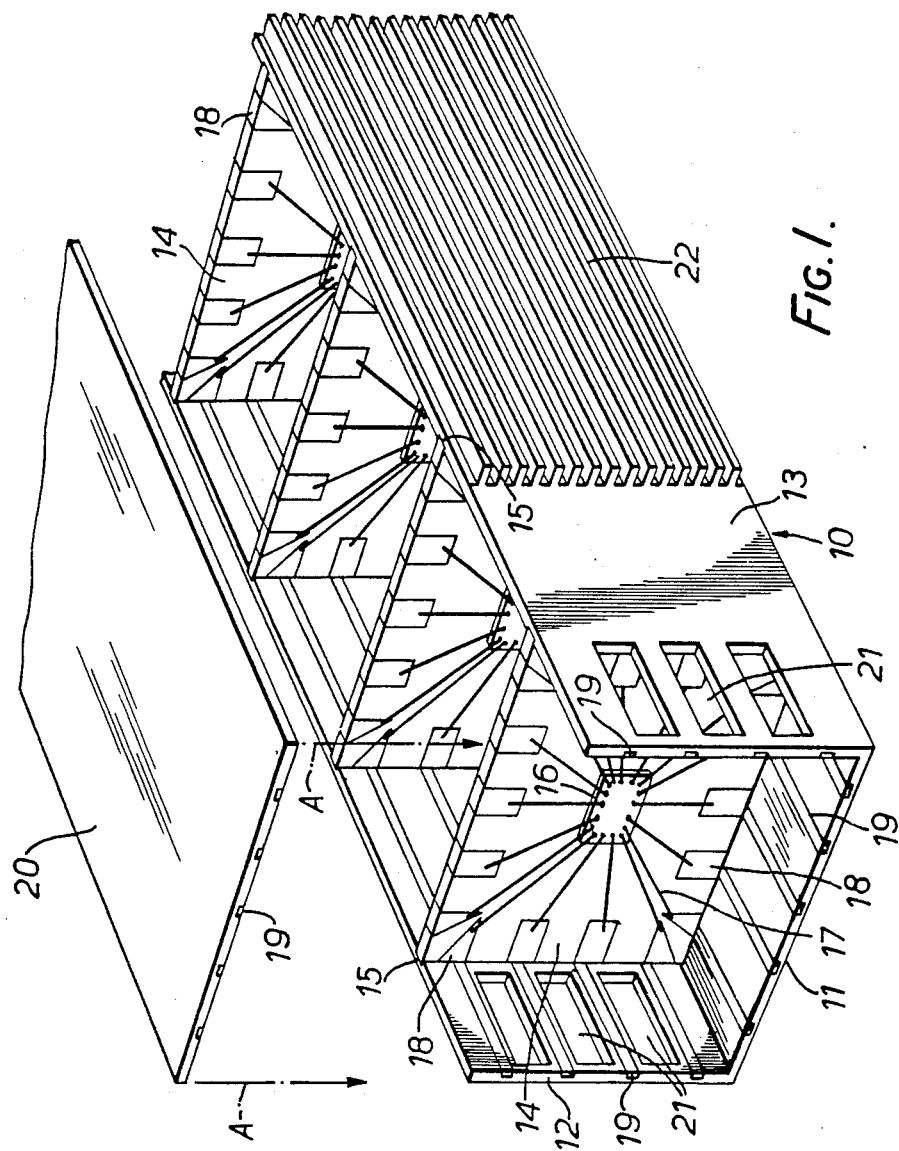
FIG. 1 shows a circuit assembly in accordance with the preferred embodiment of the invention, in partially exploded perspective.

Referring to FIG. 1, a mounting structure 10 including one bottom wall 11 and two side walls 12, 13 is arranged to retain plate members 14 by means of slots 15 in the walls, the plate members 14 being slidably engaged in the slots 15. At least some of the plate members 14 carry a circuit component such as an integrated circuit 16. The integrated circuit 16 is connected by suitable conductors 17 to conductive areas 18 provided adjacent and down the outside edges of each plate member 14 (although the precise extent of these conductive areas depends on the type of connection to be made, as explained hereinafter); the conductive areas 18 make contact with conductive strips 19 running along the side of the walls of the mounting structure 10. The mounting structure further includes a detachable top wall 20 which allows plate members 14 to be easily inserted into slots 15; the top wall 20 preferably also includes conductive strips 19 as shown for further interconnection. The top wall 20 is lowered to the closed position along arrows A and its conductive strips 19 then make contact with the top conductive areas 18 of the plate members. The top wall 20 can be retained in position by any suitable means such as clamps, screws any other means for providing positive physical contact. The top wall 20 can also be provided with slots 15, the plate members 14 then being configured to protrude slightly above the level of the side walls 13, 14.

The arrangement shown in FIG. 1 has bottom and side walls 11, 12 and 13 joined to form a U-shaped trough, in which case the plate members 14 must be slid into position; alternatively, it is possible to arrange for all the walls to be initially separate and then brought together at the assembly stage with the plate members being trapped in position as a result of the assembly.

Separation of plate members as shown in FIG. 1 provides some measure of cooling of the circuitry. Further cooling can be provided by including perforations 21 in the walls of the mounting structure 10 between slots 15 and conductive strips 19 so as to allow circulation of cooling air between the plate members 14.

Additionally, or alternatively, finning 22 can be incorporated to the outside of the mounting structure 10 to maximise cooling of the casing. A composite layer construction can be used to further improve cooling, a relatively thin insulating layer carrying conductors 19 on the inside and having a heat dissipating outer coating (which may be finned as shown at 22) which could also provide the rigidity of the structure. As regards the individual plate members 14, the circuit component 16 (which may be an integrated circuit or a hybrid thick or thin film circuit) can be enclosed by means of a cover plate which may be arranged to act as a heat sink; the mounting substrate can also be arranged to act as a heat sink if made of suitably thermally conductive material. Alternatively, the integrated circuit may be fully moulded within a suitable insulating material, such as a plastics composition, as long as any required heat dissipation characteristics are not impaired. The plate members 14 can themselves be apertured so as to effectively constitute a frame structure, and this further improves circulation of cooling air. Clearly, under particular circumstances, miniaturisation will be more important than the provision of such apertures which would take up valuable area on each plate member.

Figure 2:
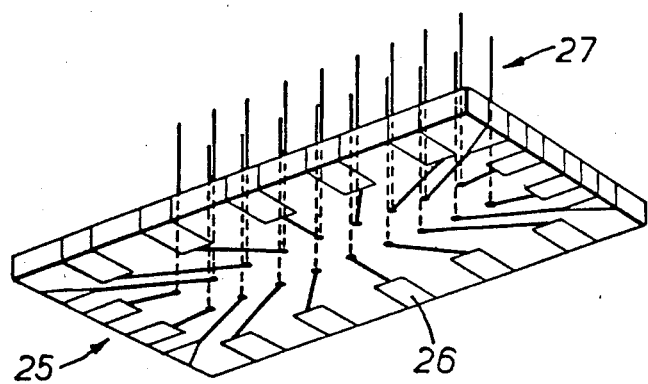
FIG. 2 shows a perspective view of one type of connector for use with the circuit assembly shown in FIG. 1.
Figure 3:
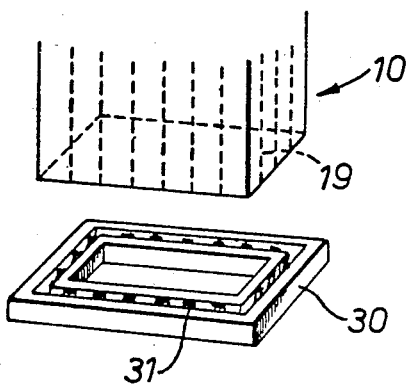
FIG. 3 shows a perspective view of an alternative means of connecting the circuit assembly to the exterior.

Referring to FIG. 2, there is shown one type of connector arrangement for the provision of electrical contact to the exterior of the circuit assembly. An end plate member 25 includes conductive areas 26 at its edges similar to those of the plate members 14 shown in FIG. 1. However, the conductive areas 26 are not connected to a component but instead to interconnecting pins 27 projecting from the plate member 25; a standard multiway-connector header plug can then effect contact with these pins. An alternative connecting arrangement is shown in FIG. 3; a mating connector socket in the form of a rectangularly configured edge-type connector socket 30 includes contacts 31 which provide connection with the conductor strips 19 on the walls of the structure 10 when the structure is inserted into the socket.

Referring to FIG. 4, there are shown three types of interconnection between plate members and conductive strips. Plate members A, B, E and G fit into slots 15 having continuous lengths of conductive strip 19 running therethrough. Plate members C, D and F fit into slots 15 having broken lengths of conductive strip, preferably running down each side of the slot and being discontinuous at the bottom. It may be required that these strips remain electrically isolated, such as if a connection is only needed between two plate members; alternatively they can be bridged across a break in either of two ways. Plate member D is shown having a conductive area 18 extending from one side of the member, around the end, and to the opposite side. Thus, insertion of this member will bridge the contact strip 19; the plate members can accordingly be designed to selectively bridge particular gaps in the strips as required. On the other hand, plate members C and F are shown having separate conductive channels on either side of each member connected via a component 40. Insertion of such a plate member will not automatically bridge the gap in the contact strip; the component 40 must first be selectively enabled by the electronics to bridge the discontinuity. One example of a possible use of this last type of connection occurs when the plate members A, B can operate as independent units, as can D, E and G; this can arise in computer applications when a number of processors can be used singly or in combination.

These various types of connection can be intermixed as required depending on the particular conductive strip; thus a single plate member can have a variety of connections thereon.

Although FIG. 1 shows conductors leading radially away from the component 16, if the configuration of the circuit requires, the conductors can be connected to any particular conductive area 18 by crossing other conductors as long as these are suitably isolated by insulation therebetween.

It will be appreciated that the overall reliability of the assembly will depend on the conductor strips 19 and areas 18 making good contact. One way be which contact may be improved between wall and plate member conductors is shown in FIG. 5. The wall includes slots 15' and conductor strip 19 and is made of a relatively flexible material. The slots 15' may be V-shaped as shown and corresponding projecting portions 29 may be included on the other side of the wall opposite slots 15'. After the assembly has been constructed by insertion of the plate members 14 in the slots 15', the assembly may be clamped together at the ends so as to compress the sides of slots 15' in a concertina-like fashion over the edges of the plate members and deform the bottoms of the slots 15'. This ensures proper conduction between strip 19 and the plate member contacts. Such clamping arrangement can also be used with the U-shaped slot assembly to improve contacting.

The plate members may be of any suitable shape, e.g. circular or hexagonal, other than the rectangular shape previously shown. Clearly, the mounting structure must be constructed to fit the chosen shape. The materials used for the plate members and the mounting structure can be chosen as appropriate for the particular application. As regards the mounting structure, the previously-mentioned scheme of using a thin insulating layer with contact strips on one side and an efficient thermal conductor material on the other is of advantage, particularly since the latter, if made of metal, will also provide substantial rigidity to the structure. A similar layer structure could be used in the plate members, which would provide a heat sink effect, as long as no metallic contact were to be made with the conductors strips on the walls. The mounting structure can be fully enclosed or apertured as previously described; in certain applications a fully enclosed and sealed structure will be of advantage, whereas in others, a virtually open frame structure possibly consisting principally of conductive members arranged to contact with the areas on the plate members would be preferred for its superior cooling characteristics.

Of particular interest in computer applications is the establishment of common power supply lines and signal buses in the conductors running through the mounting structure. Plate members are then designed to configure to the particular standard, and continuity of the power and supply lines may be maintained, possibly selectively as mentioned with reference to FIG. 4.

Where spacing permits, it may be possible to take connections from the sides of the mounting structure rather than the end or ends as shown in FIGS. 2 and 3.

Particularly in computer applications, it may be advantageous to include a power source on one of the plate members 14. This could act as an auxiliary power supply to e.g. a memory integrated circuit, so as to effectively provide a non-volatile memory.

The "compressed" circuit assembly as described with reference to FIG. 5 is one way by which contact may be improved between plate members and conductor strips. In addition, there are a number of well-established techniques to give good contact, e.g. a resilient conductive film could be used which would maintain reilience despite a number of plate member insertions and removals.

Although in the previously described arrangements, contact has been physical pressure, and is readily breakable by removal of the plate member, in certain circumstances, it may be preferred to provide a soldered connection for added security.

As previously described, the mounting structure is made up of walls surrounding the plate members, conductor strips being provided on the walls; however, as an alternative, or in addition to this arrangement, the support and electrical contact may be provided by conductor pins running through the plates; these can make either selective or permanent connection as previously illustrated.

We claim:
1. An electrical circuit assembly, comprising:
   a plurality of substantially identically-shaped electrical component carrier members each having a predetermined plurality of electrical contacts arranged along its periphery and each being similarly sized and each carrying a respective single electrical component which is electrically connected directly to at least some of the said contacts; and
   a mounting structure supporting said members in predetermined stacked relationship;
   the mounting structure including wall portions made of relatively flexible material and a plurality of longitudinal conductive members extending along the stack and mounted on the wall portions, said wall portions including slots therein into which said conductive members extend and which are configured to accept the peripheries of said carrier members, whereby the conductive members in said slots electrically engage the contacts on the said carrier members, at least some of the conductive members each making common electrical contact with said contacts on different ones of said carrier members, whereby the mounting structure provides electrical connection between such different ones of said carrier members.

2. A circuit assembly according to claim 1, wherein said mounting structure surrounds and encloses said component carrier members.

3. A circuit assembly according to claim 2, wherein said component carrier members are generally rectangular in shape and said mounting structure is complementarily rectangular in cross-section to accept said component carrier members.

4. A circuit assembly according to claim 3, wherein said mounting structure includes openings between said component carrier members to improve cooling and facilitate testing and interconnection.

5. A circuit assembly according to claim 1, wherein at least one of the conductive members is interrupted in at least one of the said slots whereby the conductive path between portions of the conductive member on opposite sides of the said at least one slot is broken.

* * * * *